(12) United States Patent
Lee

(10) Patent No.: US 11,225,563 B2
(45) Date of Patent: Jan. 18, 2022

(54) CIRCUIT BOARD STRUCTURE AND COMPOSITE FOR FORMING INSULATING SUBSTRATES

(71) Applicant: AZOTEK CO., LTD., Taoyuan (TW)

(72) Inventor: Hung-Jung Lee, Taoyuan (TW)

(73) Assignee: AZOTEK CO., LTD., Taoyuan (TW)

( * ) Notice: Subject to any disclaimer, the term of this patent is extended or adjusted under 35 U.S.C. 154(b) by 113 days.

(21) Appl. No.: 16/520,334

(22) Filed: Jul. 23, 2019

(65) Prior Publication Data

US 2019/0345308 A1    Nov. 14, 2019

Related U.S. Application Data

(63) Continuation-in-part of application No. 15/940,988, filed on Mar. 30, 2018, now Pat. No. 10,743,423, and
(Continued)

(30) Foreign Application Priority Data

Jul. 24, 2018   (TW) .................................. 107125551

(51) Int. Cl.
*C08K 3/22* (2006.01)
*C08K 9/06* (2006.01)
(Continued)

(52) U.S. Cl.
CPC ................. *C08K 3/22* (2013.01); *C08J 5/124* (2013.01); *C08K 3/04* (2013.01); *C08K 3/041* (2017.05);
(Continued)

(58) Field of Classification Search
None
See application file for complete search history.

(56) References Cited

U.S. PATENT DOCUMENTS 5,625,474 A    4/1997  Aomori et al.
5,719,354 A *  2/1998  Jester .................. H05K 3/4617
                                                        174/255
(Continued)

FOREIGN PATENT DOCUMENTS

CN    101470278 A    7/2009
CN    101577248 A    11/2009
(Continued)

OTHER PUBLICATIONS

Chung & Jaffe—LCPs—Encyclo.Poly.Sci.—2001 (Year: 2001).*
(Continued)

*Primary Examiner* — Callie E Shosho
*Assistant Examiner* — John Vincent Lawler
(74) *Attorney, Agent, or Firm* — CKC & Partners Co., LLC

(57) ABSTRACT

The disclosure provides a composite for forming an insulating substrate. The composite includes 100 parts by weight of a liquid crystal polymer and 0.5-85 parts by weight of a dielectric additive. The liquid crystal polymer has a repeating unit represented by

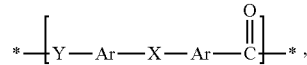

in which Ar is 1,4-phenylene, 1,3-phenylene, 2,6-naphthalene, or 4,4'-biphenylene, Y is —O— or —NH—, and X is carboxamido, imido/imino, amidino, aminocarbonylamino, aminothiocarbonyl, aminocarbonyloxy, aminosulfonyl, aminosulfonyloxy, aminosulfonylamino, carboxyl ester, (car-
(Continued)

boxyl ester)amino, (alkoxycarbonyl)oxy, alkoxycarbonyl, hydroxyamino, alkoxyamino, cyanato, isocyanato, or a combination thereof.

14 Claims, 2 Drawing Sheets

Related U.S. Application Data a continuation-in-part of application No. 15/800,051, filed on Oct. 31, 2017, now Pat. No. 10,813,213, and a continuation-in-part of application No. 15/721,968, filed on Oct. 2, 2017, now Pat. No. 11,044,802.

(60) Provisional application No. 62/558,874, filed on Sep. 15, 2017, provisional application No. 62/485,403, filed on Apr. 14, 2017, provisional application No. 62/485,403, filed on Apr. 14, 2017.

(51) Int. Cl.
  *C08K 3/04* (2006.01)
  *C08K 7/06* (2006.01)
  *C08K 3/08* (2006.01)
  *C08K 9/04* (2006.01)
  *C08K 5/3417* (2006.01)
  *H05K 1/03* (2006.01)
  *C08J 5/12* (2006.01)

(52) U.S. Cl.
  CPC .............. *C08K 3/042* (2017.05); *C08K 3/045* (2017.05); *C08K 3/08* (2013.01); *C08K 5/3417* (2013.01); *C08K 7/06* (2013.01); *C08K 9/04* (2013.01); *C08K 9/06* (2013.01); *H05K 1/0373* (2013.01); *C08K 2003/085* (2013.01); *C08K 2003/0806* (2013.01); *C08K 2003/0812* (2013.01); *C08K 2003/0856* (2013.01); *C08K 2003/0862* (2013.01); *C08K 2003/0893* (2013.01); *C08K 2003/2234* (2013.01); *C08K 2003/2237* (2013.01); *C08K 2003/2241* (2013.01); *C08K 2003/2244* (2013.01); *C08K 2003/2248* (2013.01); *C08K 2201/001* (2013.01); *C08K 2201/011* (2013.01); *H05K 2201/0141* (2013.01)

(56) References Cited

U.S. PATENT DOCUMENTS

| | | | |
|---|---|---|---|
| 5,959,708 A | 9/1999 | Lee et al. | |
| 6,495,244 B1* | 12/2002 | Andresakis | B32B 15/08 174/258 |
| 6,994,896 B2 | 2/2006 | Sethumadhavan et al. | |
| 7,387,858 B2 | 6/2008 | Chari et al. | |
| 8,465,670 B2 | 6/2013 | Kondo et al. | |
| 8,711,300 B2 | 4/2014 | Yamamoto et al. | |
| 2002/0081443 A1* | 6/2002 | Connelly | H05K 1/09 428/458 |
| 2003/0178227 A1 | 9/2003 | Matsunaga et al. | |
| 2007/0000431 A1 | 1/2007 | Yoo et al. | |
| 2007/0077502 A1 | 4/2007 | Moriya | |
| 2009/0111949 A1* | 4/2009 | Cho | C09D 177/12 525/417 |
| 2009/0151984 A1 | 6/2009 | Fujimura | |
| 2009/0151987 A1 | 6/2009 | Yang et al. | |
| 2010/0139961 A1* | 6/2010 | Kim | C08G 69/44 174/258 |
| 2010/0326696 A1 | 12/2010 | Mahapatra | |
| 2011/0256363 A1 | 10/2011 | Satou | |
| 2011/0315438 A1 | 12/2011 | Ito et al. | |
| 2012/0292085 A1 | 11/2012 | Watanabe | |
| 2013/0146344 A1 | 6/2013 | Lee et al. | |
| 2014/0087165 A1 | 3/2014 | Nair et al. | |
| 2014/0231123 A1* | 8/2014 | Onodera | B32B 27/322 174/255 |
| 2016/0037632 A1 | 2/2016 | Murakawa et al. | |

FOREIGN PATENT DOCUMENTS

| | | | |
|---|---|---|---|
| CN | 101840099 A | 9/2010 | |
| CN | 102206352 A | 10/2011 | |
| CN | 102342186 A | 2/2012 | |
| CN | 102471562 A | 5/2012 | |
| CN | 103917582 A | 7/2014 | |
| CN | 104091761 A | 10/2014 | |
| CN | 104167418 A | 11/2014 | |
| CN | 104902668 A | 9/2015 | |
| CN | 104981094 A | 10/2015 | |
| CN | 105652481 A | 6/2016 | |
| CN | 106054470 A | 10/2016 | |
| CN | 107045220 A | 8/2017 | |
| CN | 107343355 A | 11/2017 | |
| JP | 05-090740 A | 4/1993 | |
| JP | 08-097565 A | 4/1996 | |
| JP | H11249150 A | 9/1999 | |
| JP | 3208028 B2 | 9/2001 | |
| JP | 2001274554 A | 10/2001 | |
| JP | 2001284801 A | 10/2001 | |
| JP | 2003-011284 A | 1/2003 | |
| JP | 2005178056 A | 7/2005 | |
| JP | 2006-8976 A | 1/2006 | |
| JP | 2006-282678 A | 10/2006 | |
| JP | 2007/070418 * | 3/2007 | ............. B32B 15/09 |
| JP | 2007070418 A | 3/2007 | |
| JP | 2007081433 A | 3/2007 | |
| JP | 2007/161835 * | 6/2007 | ............... C08K 3/18 |
| JP | 2007-161835 A | 6/2007 | |
| JP | 2007235167 A | 9/2007 | |
| JP | 2007-253366 A | 10/2007 | |
| JP | 2008/037982 * | 2/2008 | ............. B32B 27/36 |
| JP | 2008-37982 A | 2/2008 | |
| JP | 2009246200 A | 10/2009 | |
| JP | 2010-168410 A | 8/2010 | |
| JP | 2010-532567 A | 10/2010 | |
| JP | 2011032316 A | 2/2011 | |
| JP | 2011080170 A | 4/2011 | |
| JP | 2011-134884 A | 7/2011 | |
| JP | 2011-216841 A | 10/2011 | |
| JP | 2012033869 A | 2/2012 | |
| JP | 2012046742 A | 3/2012 | |
| JP | 2012242442 A | 12/2012 | |
| JP | 2012242622 A | 12/2012 | |
| JP | WO2011/018837 A1 | 1/2013 | |
| JP | 2014120580 A | 6/2014 | |
| JP | 2014533325 A | 12/2014 | |
| JP | 2015183159 A | 10/2015 | |
| JP | 2016062954 A | 4/2016 | |
| JP | 2017075339 A | 4/2017 | |
| KR | 20020095505 A | 12/2002 | |
| KR | 10-2011-0073272 A | 6/2011 | |
| KR | 1020120001623 A | 1/2012 | |
| KR | 10-2013-0047456 A | 5/2013 | |
| KR | 10-2016-0002401 A | 1/2016 | |
| TW | 538663 | 6/2003 | |
| TW | 201328443 A | 7/2013 | |
| TW | 201706689 A | 2/2017 | |
| WO | 2004070694 A2 | 8/2004 | |
| WO | 2013/065453 A1 | 5/2013 | |
| WO | 2014/147903 A1 | 9/2014 | |
| WO | 2015/050080 A1 | 4/2015 | |
| WO | 2018056294 A1 | 3/2018 | |
| WO | 2018101214 A1 | 6/2018 | |

OTHER PUBLICATIONS

Barium—Titanate—(-BaTiO3-)—Properties-and-Applications (Year: 2004).*

Okamoto—Newly developed LCP film fabricated by solvent-casting—2005 (Year: 2005).*

(56) References Cited

OTHER PUBLICATIONS

Kobayashi—JP 2007-161835 A—IDS—MT—dielectric ceramic+ resin—2007 (Year: 2007).*

Niira—JP 2007-070418 A—IDS—MT—adhesive for foil-clad laminate—2007 (Year: 2007).*

Obinata—JP 2008-037982 A—MT—JP SR D#2—liquid crystal polyester w—maleimide groups—2008 (Year: 2008).*

Sinh—AlN+LCP ester amide—soluble in pyrrolidone—Poly.Comp.—2012 (Year: 2012).*

Liquid Crystal Polymer (LCP) Typical Properties Generic LCP _ UL Prospector (Year: 2021).*

Dutta et al., "Blends containing liquid crystalline polymers: Preparation and properties of melt-drawn fibers, unidirectional prepregs, and composite laminates," Poly. Comp., vol. 13, pp. 394-401, Oct. 1992.

Noznicki, "Films and Adhesives," Flex Circuit News, Aug. 2001.

Okamoto et al., "Newly developed LCP film fabricate by solvent-casting method," Sumitomo Kagaku, vol. 2005-I (Year 2005).

Sinh et al., "Thermal, dielectric, and rheological properties of aluminum nitride/liquid crystalline copoly(ester amide) composite for the application of thermal interface materials," Poly. Comp., vol. 33, pp. 2140-2146. (Year: 2012).

U.S. Appl. No. 62/485,403, Specification, Provisional application, filed Apr. 14, 2017.

Yang, Kui-Sheng et al., China Strategic Emerging Industry-New Material—Engineering plastics, Dec. 31, 2017 Version 1, Published by China Railway Publishing House Co., Ltd.

Yeongyu Choi et al., "Fast Turn-Off Switching of Vertically-Aligned Negative Liquid Crystals by Fine Patterning of Pixel Electrodes," MDPI, Journal Crystals, Jul. 3, 2017, 8 pages.

\* cited by examiner

CIRCUIT BOARD STRUCTURE AND COMPOSITE FOR FORMING INSULATING SUBSTRATES

CROSS-REFERENCE TO RELATED APPLICATION

This application is a Continuation-in-part of U.S. application Ser. No. 15/800,051, filed on Oct. 31, 2017, now U.S. Pat. No. 10,813,213, which claims priority to U.S. Provisional Application Ser. No. 62/485,403, filed Apr. 14, 2017, Taiwan Application Serial Number 106127157, filed Aug. 10, 2017, Taiwan Application Serial Number 106123857, filed Jul. 17, 2017, Taiwan Application Serial Number 106202277, filed Feb. 17, 2017, and Taiwan Application Serial Number 106202228, filed Feb. 16, 2017, the entirety of which is incorporated by reference herein. This application is also a Continuation-in-part of U.S. application Ser. No. 15/721,968, filed on Oct. 2, 2017, now U.S. Pat. No. 11,044,802, which claims priority to U.S. Provisional Application Ser. No. 62/485,403, filed Apr. 14, 2017, Taiwan Application Serial Number 106123857, filed Jul. 17, 2017, Taiwan Application Serial Number 106202277, filed Feb. 17, 2017, Taiwan Application Serial Number 106202228, filed Feb. 16, 2017, the entirety of which is incorporated by reference herein. This application is also a Continuation-in-part of U.S. application Ser. No. 15/940,988, filed on Mar. 30, 2018, now U.S. Pat. No. 10,743,423, which claims priority to U.S. Provisional Application Ser. No. 62/558,874, filed Sep. 15, 2017, which is herein incorporated by reference. This application also claims priority to Taiwan Application Serial Number 107125551, filed Jul. 24, 2018, which is herein incorporated by reference.

BACKGROUND

Field of Invention

The present invention relates to a composite for forming an insulating substrate. The present invention also relates to a circuit board structure.

Description of Related Art

For consumer electronic products, the main features of system-in-package (SIP) technology should include cost reduction and downsizing. There are two types of substrates which may serve a platform for integrating components thereon. One is a common organic material substrate or a multilayer printed wiring board (PWB), and the other one is an inorganic substrate, such as a silicon substrate. The latter usually owns the advantage of downsizing as it can be combined with chip circuits and compatible with manufacturing processes of the chip. However, the cost has to be considered. As for the former, besides of its low-cost features, it can also fulfill the requirements of system-in-package nowadays by applying precise process technologies (such as high-density interconnection (HDI) technologies) and adopting certain particular materials.

In addition, as communication products have been evolving to a high-speed and high-frequency level, the substrate materials required for the development of next-generation products (such as wireless communication networks, satellite communication equipment, high-power and broadband products, high-speed computers and computer workstations) must has a high glass transition temperature ($T_g$), a low dissipation factor ($D_f$), and a low dielectric constant ($D_k$). In conventional copper foil substrates used in printed circuit boards (PCBs), the main stream is FR4 plates made of epoxy resin in terms of the quantity or technical level. However, the electrical properties (such as the dielectric constant and dissipation factor) of the FR4 substrate may not able to fulfill the requirements of high-frequency communication. Therefore, there is a need in the industry for a substrate material that possesses a high dielectric constant and can maintain its low dissipation factor.

SUMMARY

One aspect of the present invention is to provide a composite for forming an insulating substrate, and the dielectric constant value of the insulating substrate is controllable by adjusting the composition of the composite.

The composite for forming the insulating substrate includes 100 parts by weight of a liquid crystal polymer and 0.5 parts by weight to 85 parts by weight of a dielectric additive. The liquid crystal polymer has a repeating unit represented by

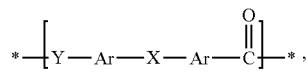

in which Ar is

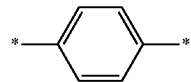 [SMILES: *c1ccc(*)cc1]

(1,4-phenylene),

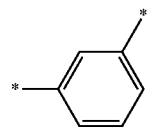 [SMILES: *c1cccc(*)c1]

(1,3-phenylene),

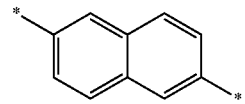 [SMILES: *c1ccc2cc(*)ccc2c1]

(2,6-naphthalene), or

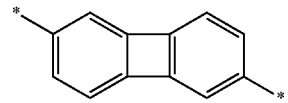 [SMILES: *c1ccc2c(c1)-c1ccc(*)cc1-2]

(4,4'-biphenylene), Y is *—O—* or

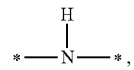

X is

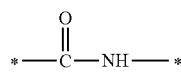

(carboxamido),

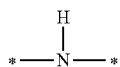

(imido/imino),

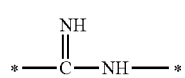

(amidino),

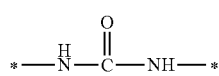

(aminocarbonylamino),

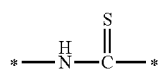

(aminothiocarbonyl),

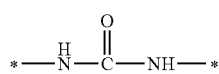

(aminocarbonyloxy),

(aminosulfonyl),

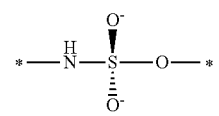

(aminosulfonyloxy),

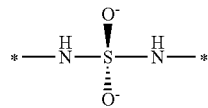

(aminosulfonylamino),

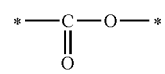

(carboxyl ester),

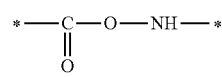

((carboxyl ester) amino),

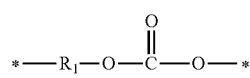

((alkoxycarbonyl) oxy),

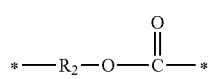

(alkoxycarbonyl),

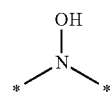

(hydroxyamino),

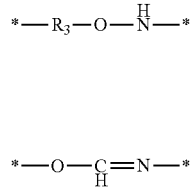

(alkoxyamino),

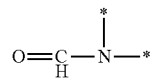

(cyanato),

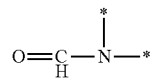

(isocyanato), or a combination thereof, in which $R_1$, $R_2$ and $R_3$ is $C_nH_{2n}$, and n is a positive integer.

According to some embodiments of the present invention, the dielectric additive is selected from the group consisting of a ceramic material, a modified ceramic material, a conductive particle, a modified conductive particle, an organic material, and a modified organic material.

According to some embodiments of the present invention, the ceramic material is selected from the group consisting of barium titanate (BT), lead titanate, barium strontium titanate (BST), titanium oxide, lead oxide, lead zirconate titanate (PZT), perovskite cubic crystal structure ($CaCu_3Ti_4O_{12}$, CCTO) and lead magnesium niobate-lead titanate (PMN-PT).

According to some embodiments of the present invention, the modified ceramic material has a modified moiety, and the modified moiety includes silane group.

According to some embodiments of the present invention, the conductive particle includes a carbon-based particle and a metal particle.

According to some embodiments of the present invention, the carbon-based particle is selected from the group consisting of $C_{60}$, graphene, carbon black, carbon fiber, and carbon nanotube (CNT).

According to some embodiments of the present invention, the metal particle is selected from the group consisting of silver, aluminum, copper, nickel, zinc, and iron.

According to some embodiments of the present invention, the modified conductive particle includes a modified carbon-based particle, and the modified carbon-based particle has a modified moiety selected from the group consisting of amino, anilino, carboxamido, carboxyl, and hydroxyl.

According to some embodiments of the present invention, the organic material is selected from the group consisting of conductive polyaniline and copper phthalocyanine (CuPc).

According to some embodiments of the present invention, the modified organic material has a modified moiety, and the modified moiety is selected from the group consisting of sulfo, hydroxyl, ether, amino and 4-vinylbenzyl chloride.

Another aspect of the present invention is to provide a circuit board structure. The circuit board structure includes at least one insulating substrate and at least one redistribution layer. The insulating substrate includes the aforementioned composite for forming the insulating substrate. The redistribution layer is disposed on the insulating substrate.

According to some embodiments of the present invention, the circuit board structure further includes an adhesive layer disposed between the insulating substrate and the redistribution layer.

According to some embodiments of the present invention, the adhesive layer is selected from the group consisting of fluorine resins, polyphenylene ether resins (PPO/PPE), aralkyl epoxy resins, epoxy resins, phenoxy resins, acrylic resins, urethane resins, silicone rubber resins, poly(p-xylylene) resins, liquid crystal polymer, bismaleimide resins, and polyimine resins.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
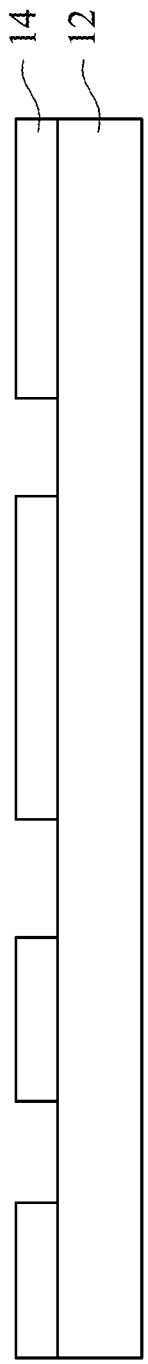
FIG. 1 to FIG. 4 illustrates schematic sectional views of a circuit board structure according to various embodiments of the present invention.

The following disclosure provides many different embodiments, or examples, for implementing different features of the provided subject matter. Specific examples of components and arrangements are described below to simplify the present disclosure. These are, of course, merely examples and are not intended to be limiting.

In order to make the description of the present disclosure more detailed and complete, reference is made to the accompanying drawings and the various embodiments described below. Wherever possible, the same reference numbers are used in the drawings and the description to refer to the same or like parts.

The terms used throughout the description refer to their general meanings, and some certain terms will be specifically defined below so as to provide additional guidance for practitioners. For convenience, some certain terms may be specifically labeled, such as using italics and/or quotation marks. Whether they are specifically marked or not, the scope and meaning of these terms are not affected, and their scope and meaning are the same as the usual. It is understood that there are various ways for describing the same term. Therefore, alternative languages and synonyms for one or more terms may be used in this description, and it is not intended to state that the term has any special meaning in this description. Synonyms may be used herein, and the use of one or more synonyms repeatedly does not preclude the other synonyms. Any of the examples discussed in this specification are for illustrative purposes only and are not intended to limit the invention in any aspect. Similarly, the invention is not limited to the various embodiments set forth in this specification.

The singular forms "a," "an," and "the" include the plural reference unless expressly described otherwise. Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

One aspect of the present invention is to provide a composite for forming an insulating substrate. The composite includes 100 parts by weight of a liquid crystal polymer and 0.5 to 85 parts by weight of a dielectric additive. The liquid crystal polymer has a repeating unit represented by Formula (1):

Formula (1)

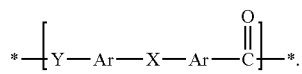

In Formula (1), Ar may be 1,4-phenylene, which is represented by

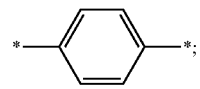

1,3-phenylene, which is represented by

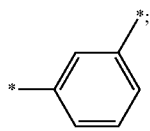

2,6-naphthalene, which is represented by

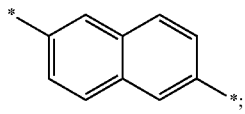

or 4,4'-biphenylene, which is represented by

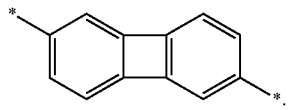

In Formula (1), Y may be or *—O—* or

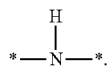

In Formula (1), X may be carboxamido, which is represented by

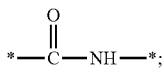

imido/imino, which is represented by

amidino, which is represented by

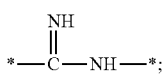

aminocarbonylamino, which is represented by

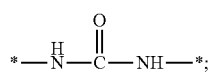

aminothiocarbonyl, which is represented by

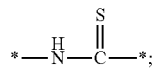

aminocarbonyloxy, which is represented by

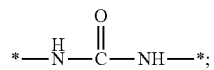

aminosulfonyl, which is represented by

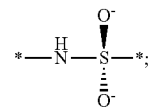

aminosulfonyloxy, which is represented by

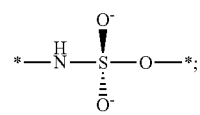

aminosulfonylamino, which is represented by

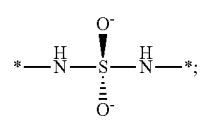

carboxyl ester, which is represented by

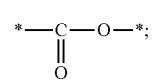

(carboxyl ester) amino, which is represented by

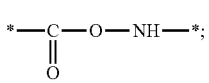

(alkoxycarbonyl)oxy, which is represented by

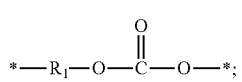

alkoxycarbonyl, which is represented by

hydroxyamino, which is represented by

alkoxyamino, which is represented by

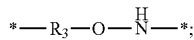

cyanato, which is represented by

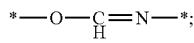

isocyanato, which is represented by

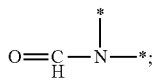

or a combination thereof, in which $R_1$, $R_2$, and $R_3$ is represented by $C_nH_{2n}$, in which n is a positive integer.

According to various examples of the present invention, there are various combinations where Ar, X, and Y can be arbitrarily selected from the group to which they belong. Different combinations may bring the same or different technical effects.

In detail, the liquid crystal polymer is soluble in certain solvents to form a solution of the liquid crystal polymer. For example, the solvent may be selected from the group consisting of n-methyl-2-pyrrolidone, N,N-dimethylacetamide, gamma-Butyrolactone, dimethylformamide, 2-Butoxyethanol, and 2-Ethoxyethanol. Compared with the conventional liquid crystal polymer, the solubility of the liquid crystal polymer in the certain solvents is higher than that of the conventional liquid polymer. It is understood that a layer of the solution of liquid crystal polymer may be formed on a carrier board by a coating process or the like, and then the solvent may be removed by a heating process, such that an insulating substrate having the liquid crystal polymer thereon is formed.

For example, the solution of liquid crystal polymer may be a solution of an aromatic liquid crystal polyester, which contains one of the solvents described hereinbefore and an aromatic liquid crystal polyester. The weight percentage of the aromatic liquid crystal polyester (i.e., solid content) is 1 wt % to 85 wt %, such as 5 wt %, 15 wt %, 25 wt %, 35 wt %, 45 wt %, 55 wt %, 65 wt %, or 75 wt %. If the weight percentage of the aromatic liquid crystal polyester is less than a certain value, for example, 1 wt %, a number of coating processes are required to achieve the desired thickness of the insulating substrate, and therefore it is time-consuming and uneconomical. On the other hand, if the weight percentage of the aromatic liquid crystal polyester is greater than a certain value, such as 85 wt %, the solid aromatic liquid crystal polyester is not readily dissolved in the solvent, and therefore gelatinization may occur. Specifically, the aromatic liquid crystal polyester has a repeating unit represented by:

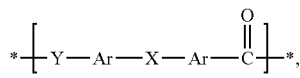

in which Ar is 1,4-phenylene, 1,3-phenylene, 2,6-naphthalene, or 4,4'-biphenylene, Y is —O— or —NH—, X is carboxamido, imido (imino), amidino, aminocarbonylamino, aminothiocarbonyl, aminocarbonyloxy, aminosulfonyl, aminosulfonyloxy, aminosulfonylamino, carboxyl ester, (carboxyl ester) amino, (alkoxycarbonyl)oxy, alkoxycarbonyl, hydroxyamino, alkoxyamino, cyanato, isocyanato, or a combination thereof.

If the content of the dielectric additive is greater than a certain value, such as 85 parts by weight, the particles of the dielectric additive may be electrically connected to each other, such that the composite may change from an insulator to a conductor, and its dielectric constant and electrical conductivity may vary drastically. In other words, the insulating properties of the composite may disappear. In various embodiments, the dielectric additive is selected from the group consisting of a ceramic material, a modified ceramic material, a conductive particle, a modified conductive particle, an organic material, and a modified organic material. More specifically, in various examples, the ceramic material is selected from the group consisting of barium titanate (BT), lead titanate, barium strontium titanate (BST), titanium oxide, lead oxide, lead zirconate titanate (Pb(ZrTi)O$_3$, PZT), perovskite cubic crystal structure (CaCu$_3$Ti$_4$O$_{12}$, CCTO) and lead magnesium niobate-lead titanate (PMN-PT). In various examples, the modified ceramic material has a modified moiety, and the modified moiety of the modified ceramic material includes silanyl group. In various examples, the conductive particle includes a carbon-based particle and a metal particle. For example, the carbon-based particle is selected from the group consisting of C$_{60}$, graphene, carbon black, carbon fiber, and carbon nanotube (CNT). The metal particle is selected from the group consisting of silver, aluminum, copper, nickel, zinc, and iron. In various examples, the modified conductive particle includes a modified carbon-based particle having a modified moiety, which is selected from the group consisting of amino, anilino, carboxamido, carboxyl, and hydroxyl. In various examples, the organic material is selected from the group consisting of conductive polyaniline and copper phthalocyanine (CuPc). In various examples, the modified organic material has a modified moiety, and the modified moiety of the modified organic material is selected from the group consisting of sulfo, hydroxyl, ether, amino, and 4-vinylbenzyl chloride. It is understood that the dielectric additive may be added to the solution of liquid crystal polymer to form a mixture, and the mixture may be coated on the carrier board by a coating process or a similar process. A heating process may be performed subsequently to remove the solvent, such that an insulating substrate with a high dielectric constant is formed. It is noted that the dielectric additive is insoluble in the solution of liquid crystal polymer. The dielectric additive is substantially uniformly dispersed in the solution of liquid crystal polymer.

In some embodiments, an average particle diameter (i.e., particle size) of the dielectric additive ranges from 0.1 μm to 20 μm. According to various examples, when the average particle diameter of the dielectric additive is less than a certain value such as 0.1 μm, there is no significant rise in the dielectric constant. On the other hand, when the average particle diameter of the dielectric additive is greater than a certain value, for example, 20 µm, it is difficult to control the dispersion of the particles of dielectric additive, and the particles of dielectric additive are likely to be electrically connected with each other. Hence the insulating properties of the composite may disappear. Based on above, the average particle diameter of the dielectric additive may be such as 0.5 µm, 1.0 µm, 1.5 µm, 2.0 µm, 2.5 µm, 3.0 µm, 3.5 µm, 4.0 µm, 4.5 µm, 5.0 µm, 5.5 µm, 6.0 µm, 6.5 µm, 7.0 µm, 7.5 µm, 8.0 µm, 8.5 µm, 9.0 µm, 9.5 µm, 10.0 µm, 12.0 µm, 14.0 µm, 16.0 µm, or 18.0 µm.

In general, the liquid crystal polymer has excellent processability and heat resistance, as well as low water absorption, low dielectric constant ($D_k$) (for example, between 2 and 4), and low dissipation factor ($D_f$) (for example, from 0.003 to 0.008). Therefore, as the dielectric additive is added in the composite which is used to form the insulating substrate of the present invention, the dielectric constant of the composite may be increased to 3 to 200, and the dissipation factor is remained to be 0.003 to 0.008. Typically, based on the value of the dielectric constant, the dielectric material may be classified as a high-k material (for example, the dielectric constant is greater than 4) or a low-k material (for example, the dielectric constant is less than or equal to 4). The high-k material is widely used as gate dielectric material, energy storage material and wireless communication material, as it may reduce the power consumption of electronic products. The low-k material is widely used in the material of electronic package as it may reduce the adverse effects arisen from RC delay.

In other alternative embodiments, the composite for forming the insulating substrate may include a modified polyimide (PI) and a dielectric additive. Specifically, the modified polyimide (PI) has a group or a monomer unit derived from an aromatic monomer and/or a group or a monomer unit derived from a functional monomer which may reduce water absorption. Illustrative examples of the aromatic monomer include aromatic diamine, aromatic dianhydride, aromatic polyamide, polyphenylene terephthalamide (PPTA), (poly (p-phenylene-2,6-benzobisoxazole (PBO), and poly(p-hydroxybenzoic acid-co-2-hydroxy-6-naphthoic acid). The features and examples of the dielectric additive have been described above and therefore are not repeated herein.

Another aspect of the present invention is to provide a circuit board structure 10. FIG. 1 to FIG. 4 illustrates schematic sectional views of a circuit board structure 10 according to various embodiments of the present invention. Reference is made to FIG. 1. The circuit board structure 10 includes at least one insulating substrate 12 and at least one redistribution layer 14. The insulating substrate 12 includes the composite for forming the insulating substrate described above. In other words, the composite for forming the insulating substrate 12 includes 100 parts by weight of a liquid crystal polymer and 0.5 parts to 85 parts by weight of a dielectric additive. The features and examples of the liquid crystal polymer and the dielectric additive have been described above and therefore are not repeated herein. The redistribution layer 14 is disposed on the insulating substrate.

In some examples, the material of the redistribution layer 14 may include copper, aluminum, iron, silver, palladium, nickel, chromium, molybdenum, tungsten, zinc, manganese, cobalt, gold, tin, lead or stainless steel, or an alloy of at least two of the aforementioned metal. In detail, the redistribution layer 14 may be formed by etching a metal foil, such as copper foil, aluminum foil, silver foil, tin foil or/and gold foil. In some examples, the surface of the redistribution layer 14 may be subjected to a coating process, such that the surface of the redistribution layer 14 is covered by a coating layer (not shown), for example, a nickel-gold layer, a zinc layer, or a cobalt layer.

Figure 2:
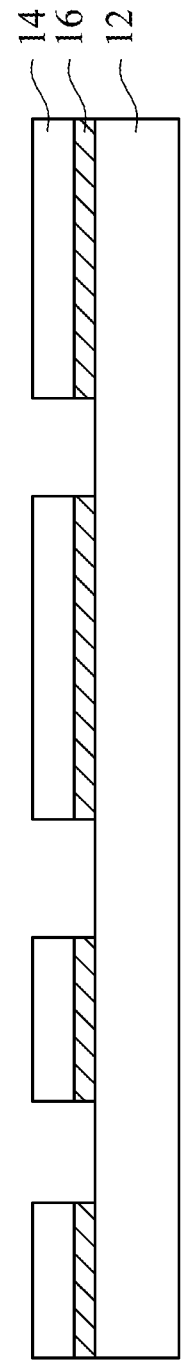
Figure 3:
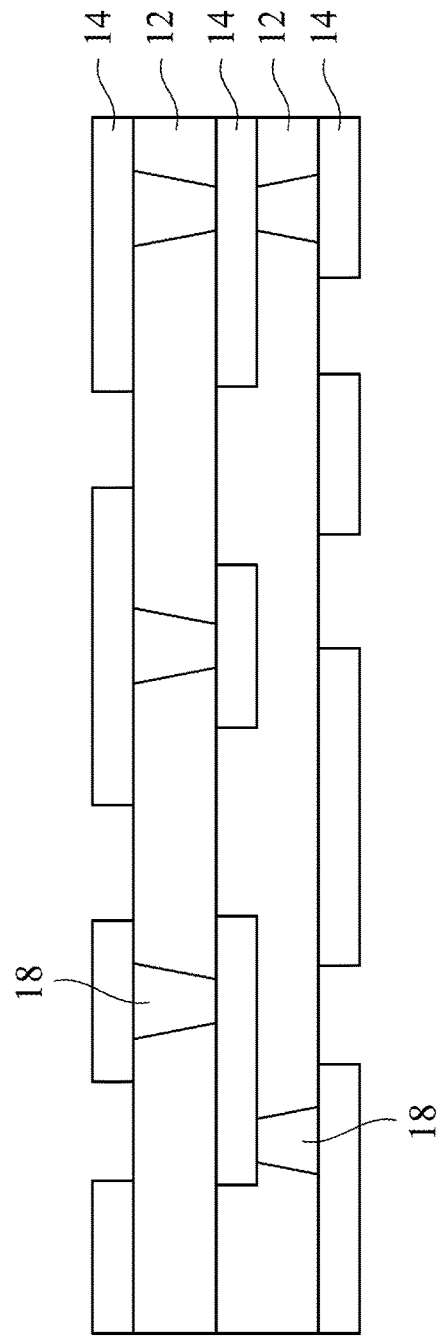

Reference is made to FIG. 2. In various examples, the circuit board structure 10 may further include an adhesive layer 16 disposed between the insulating substrate 12 and the redistribution layer 14. More specifically, the adhesive layer 16 has the same pattern as that of the redistribution layer 14. As the adhesive layer 16 is formed, the bonding between the insulating substrate 12 and the redistribution layer 14 can be enhanced. In various examples, the adhesive layer 16 is selected from the group consisting of fluorine resins, polyphenylene ether resins (PPO/PPE), aralkyl epoxy resins, epoxy resins, phenoxy resins, acrylic resins, urethane resins, silicone rubber resins, poly(p-xylylene) resins, liquid crystal polymer, bismaleimide resins, and polyimine resins. For example, the fluorine resins may include polytetrafluoroethylene (PTFE), polyfluoroalkoxy, (PFA), fluorinated ethylene propylene (FEP), ethylene-tetra-fluoro-ethylen (ETFE); and the aralkyl epoxy resins may include biphenyl type epoxy resin. The schematic view of the circuit board structure 10 as shown in FIG. 1 and FIG. 2 is a single-sided circuit board.

However, the present invention is not limited to the single-sided circuit board. The circuit board structure 10 may be a multilayer circuit board, in which the number of the insulating substrate 12 and redistribution layer 14 may be adjusted based on the desired circuit layout. The difference between the circuit board structure 10 in FIG. 3 and the circuit board structure 10 in FIG. 1 is that the circuit board structure 10 in FIG. 3 has two insulating substrates 12 and three redistribution layers 14, and each of the insulating substrates 12 is sandwiched between adjacent ones of redistribution layers 14. It is understood that the signal transmission between any two redistribution layers 14 is achieved through the conductive blind via 18 disposed in the insulating substrate 12. Therefore, the circuit board structure 10 may further include at least one conductive blind via 18 penetrating through one of the insulating substrate 12. In some examples, the conductive blind via 18 and the redistribution layer 14 may include a similar material.

Figure 4:
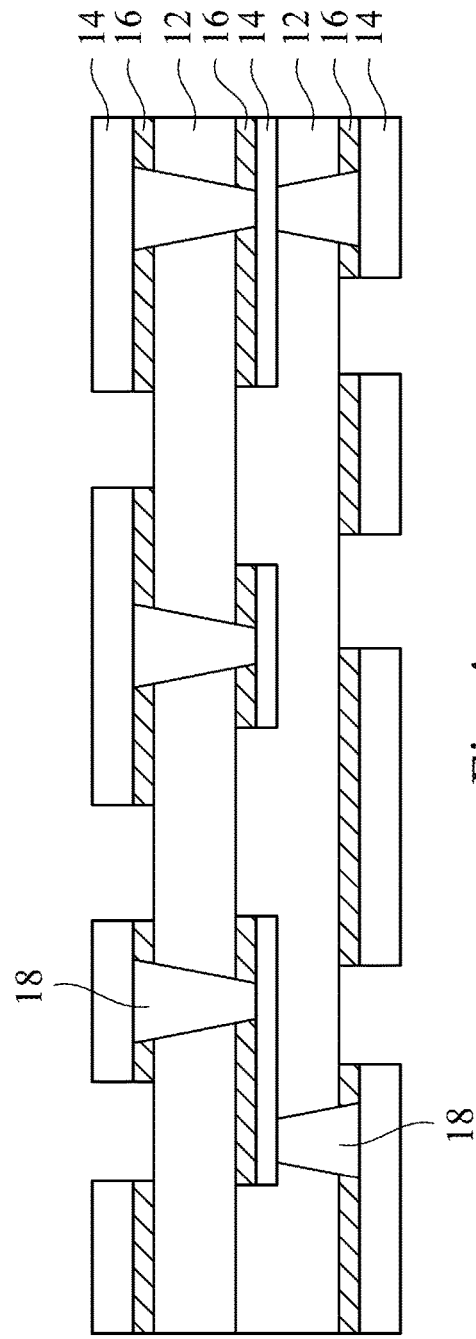

Reference is made to FIG. 4. In various examples, the circuit board structure 10 may further include at least an adhesive layer 16 disposed between the adjacent insulating substrate 12 and redistribution layer 14. More specifically, the conductive blind via 18 penetrates through the corresponding adhesive layer(s) 16 and electrically connects adjacent redistribution layers 14. The features and examples of the adhesive layer 16 have been described above and therefore are not repeated herein. In other examples of the present invention, the circuit board structure may have more than two insulating substrates and more than two redistribution layers, in which the insulating substrates and the redistribution layers are arranged alternatingly.

In summary, the present invention provides a composite for forming an insulating substrate. The composite has a liquid crystal polymer and a dielectric additive. The dielectric constant of the insulating substrate may be drastically increased by adjusting the composition of the composite. For the resulted insulating substrate having a high dielectric constant (for example, between 4 to 200), its dissipation factor can still be low (for example, between 0.003 to 0.008) under a high frequency signal transmission, such that the delay or loss of the signal transmission may be reduced, and the speed and/or frequency of the signal transmission can be increased. In addition, the composite for forming the insulating substrate in the present invention may also ensure the quality and stability of the signal transmission under severe conditions of high temperature and high humidity. Moreover, the composite for forming the insulating substrate in the present invention may form an insulating substrate having a low dielectric constant (for example, less than or equal to 4). The insulating substrate having a low dielectric constant and the insulating substrate having a high dielectric constant may be combined and stacked to form novel electronic products having multiple features.

Although the present invention has been described in considerable detail with reference to certain embodiments thereof, other embodiments are possible. It will be apparent to those skilled in the art that various modifications and variations can be made to the structure of the present invention without departing from the scope or spirit of the invention. Therefore, the scope of the appended claims should not be limited to the description of the embodiments described above.

What is claimed is:

1. A composite for forming an insulating substrate, comprising:
   100 parts by weight of a liquid crystal polymer, wherein the liquid crystal polymer consists essentially of a monomer unit represented by:

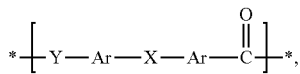

wherein Ar is

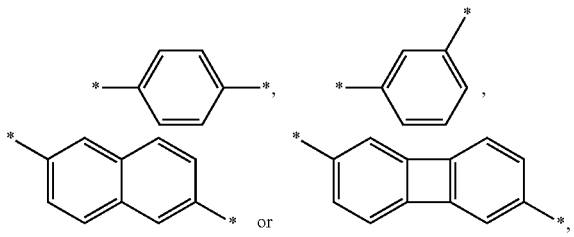

Y is *—O—* or

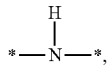

X is

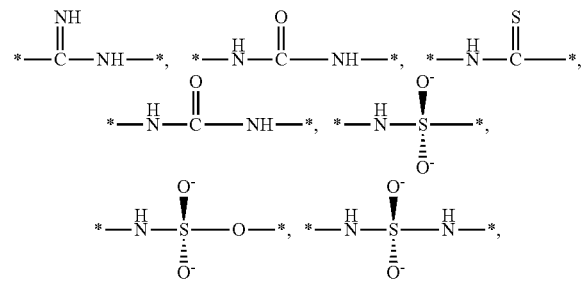

-continued

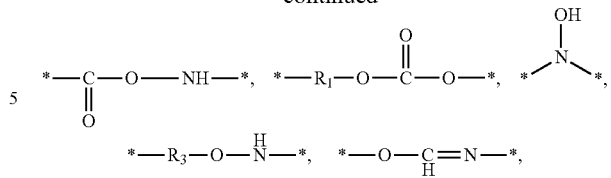

or a combination thereof, wherein $R_1$, $R_2$, and $R_3$ is $C_nH_{2n}$, and n is a positive integer; and
   0.5 parts to 85 parts by weight of a dielectric additive.

2. The composite of claim 1, wherein the dielectric additive is selected from the group consisting of a ceramic material and a modified ceramic material.

3. The composite of claim 2, wherein the ceramic material is selected from the group consisting of barium titanate (BT), lead titanate, barium strontium titanate (BST), titanium oxide, lead oxide, lead zirconate titanate (PZT), perovskite cubic crystal structure ($CaCu_3Ti_4O_{12}$, CCTO), and lead magnesium niobate-lead titanate (PMN-PT).

4. The composite of claim 2, wherein the modified ceramic material comprises a modified moiety, and the modified moiety comprises a silane group.

5. The composite of claim 1, wherein the dielectric additive comprises a carbon-based particle and a metal particle.

6. The composite of claim 5, wherein the carbon-based particle is selected from the group consisting of $C_{60}$, graphene, carbon black, carbon fiber, and carbon nanotube.

7. The composite of claim 5, wherein the metal particle is selected from the group consisting of silver, aluminum, copper, nickel, zinc, and iron.

8. The composite of claim 1, wherein the dielectric additive comprises a modified carbon-based particle, and the modified carbon-based particle comprises a modified moiety selected from the group consisting of amino, anilino, carboxamido, carboxyl, and hydroxyl.

9. The composite of claim 1, wherein the dielectric additive is selected from the group consisting of conductive polyaniline and copper phthalocyanine (CuPc).

10. The composite of claim 1, wherein the dielectric additive comprises a modified moiety selected from the group consisting of sulfo, hydroxyl, ether, amino, and 4-vinylbenzyl chloride.

11. The composite of claim 1, wherein an average particle diameter of the dielectric additive ranges from 0.1 µm to 20 µm.

12. A circuit board structure, comprising:
    at least one insulating substrate comprising the composite of claim 1; and
    at least one redistribution layer disposed over the insulating substrate.

13. The circuit board structure of claim 12, further comprising an adhesive layer disposed between the at least one insulating substrate and the at least one redistribution layer.

14. The circuit board structure of claim 13, wherein the adhesive layer is selected from the group consisting of fluorine resins, polyphenylene ether resins (PPO/PPE), aralkyl epoxy resins, epoxy resins, phenoxy resins, acrylic resins, urethane resins, silicone rubber resins, poly(p-xylylene) resins, liquid crystal polymer, bismaleimide resins, and polyimine resins.

* * * * *